United States Patent [19]

Mikami

[11] Patent Number: 4,985,700
[45] Date of Patent: Jan. 15, 1991

[54] VARIABLE-LENGTH CODING/DECODING DEVICE

[75] Inventor: Fumiyuki Mikami, Yokohama, Japan

[73] Assignee: Canon Kabushiki Kaisha, Tokyo, Japan

[21] Appl. No.: 313,546

[22] Filed: Feb. 22, 1989

[30] Foreign Application Priority Data

Mar. 1, 1988 [JP] Japan .................. 63-47842
Mar. 1, 1988 [JP] Japan .................. 63-47849

[51] Int. Cl.$^5$ ............................................. H03M 7/00
[52] U.S. Cl. ..................................... 341/59; 341/50; 341/51; 341/58; 341/67
[58] Field of Search ................. 341/5, 59, 67, 58; 358/261.1

[56] References Cited

U.S. PATENT DOCUMENTS

| | | | |
|---|---|---|---|
| 4,571,575 | 2/1986 | McCullough | 341/59 |
| 4,593,267 | 6/1986 | Kuroda et al. | 341/67 |
| 4,641,128 | 2/1987 | Schouhamer et al. | 341/67 |
| 4,675,652 | 6/1987 | Machado | 341/67 |
| 4,727,421 | 2/1988 | Koga | 358/261.1 |
| 4,760,378 | 7/1988 | Iketani et al. | 341/59 |
| 4,833,470 | 5/1989 | Iketani | 341/59 |
| 4,833,471 | 5/1989 | Tokuume et al. | 341/67 |

*Primary Examiner*—William M. Shoop, Jr.
*Assistant Examiner*—Nancy V. Le
*Attorney, Agent, or Firm*—Fitzpatrick, Cella, Harper & scinto

[57] ABSTRACT

In a variable-length coding/decoding device, an r·m-bit data word is converted into an r·n-bit code word, where r is an integer having the relationship $1 \leq r \leq r_{max}$, a basic data word length consists of a m bits (m is a positive integer), and a basic code word length consists of n bits (n is a positive integer), and each of data words of a variable-length run-length-limited code limiting the run number of bits of a first value (e.g., "o") between successive bits of a second value (e.g., "1") in a binary-coded bit string generated by concatenation of code words after the conversion to a value no smaller than d and no larger than k into a code word corresponding to thereto. At that time, an input data word is once coded into an $r_{max}$·q-bit (q is a positive integer) code word, and then divided into $r_{max}$ blocks each consisting of q bits, and a code word in each of the blocks is coded to obtain a variable-length run-length-limited code word. Also, the variable-length run-length-limited code word is inverted into a data word corresponding thereto. At that time, the input code word is divided into $r_{max}$ blocks each consisting of n bits, and a code word in each of the blocks is once decoded into a q-bit (q is a positive integer) code word. Then, the $r_{max}$·q-bit code word is decoded to obtain a data word.

12 Claims, 4 Drawing Sheets

VARIABLE-LENGTH CODING/DECODING DEVICE

BACKGROUND OF THE INVENTION

1. Field of the Invention

This invention relates to a variable-length coding/decoding device which is applied to transmission or recording of digital signals.

2. Description of the Related Art

In accordance with providing higher density of recording, there have been developed various kinds of recording codes used in recording and reproducing digital signals on optical disks, magnetic disks or the like. For a recording code, which is a bit string of information data to be recorded converted into a form suitable for recording, the following properties are required.

(1) Minimum magnetization reversal interval: $T_{min}$

It is desirable that $T_{min}$ be large in order to be influenced as little as possible by a bandwidth limitation of a recording and reproducing system.

(2) Maximum magnetization reversal interval: $T_{max}$

It is desirable that $T_{max}$ be small for ease of extraction of clock information, in order to obtain a self-clock function.

(3) Detecting window width: $T_w$

This term represents an allowance for time-base variation, such as peak shift of reproduced signals due to jitter or waveform interference, or the like. It is desirable that $T_w$ be large.

For example, as the recording code, the run-length-limited (abbreviated hereafter as RLL) code has hitherto been used. The RLL code is called the (d, k, n, m, $r_{max}$) code, where d and k are the minimum value and maximum value, respectively, of the run number of "0"'s between successive "1"'s (or vice versa) within a bit string of codes after conversion, n is the basic data word length, m is the basic code word length, and $r_{max}$ is the number of code word lengths. Using these parameters, the following representations hold:

$$T_{min} = (d+1) \cdot T_w$$

$$T_{max} = (k+1) \cdot T_w$$

$$T_w = (m/n) \cdot T$$

(T: the length of one bit of a data word). Among the RLL codes, a variable-length code is suitable for high densification in that performance of a similar degree can be realized with smaller code word length and code word number than by a fixed-length code, or the like.

In order to use a recording code, it is necessary to provide a coding device for converting a data word into a code word. Among methods for providing a coding device, there is a method of constituting the device by combining gate circuits, and a method in which a bit string of information data is used as address signals, and access is made to a ROM (Read Only Memory) in which a bit string of code words has been written. When a ROM is used in a coding device using the (d, k, m, n, $r_{max}$) code, its required capacity $V_1$ is represented by $V_1 = 2r_{max} \cdot m \cdot r_{max} \cdot n$ bits. In a variable-length code, it is necessary to provide information representing how many bits the data word has been coded into in order to provide word synchronization. This information is usually written also in the same ROM. In the above-described capacity $V_1$, however, the memory capacity corresponding to this information was excluded. For example, a conventional variable-length coding circuit using the (4, 19, 2, 5, 6) code, the correspondence table between data words and code words of which is shown in Table 1 to be described later, is configured as shown in FIG. 1.

Figure 1:
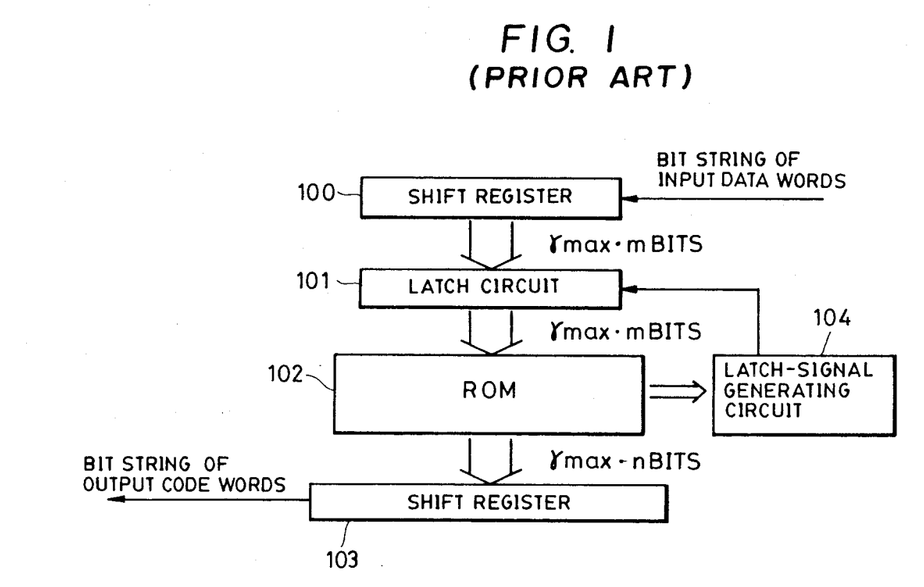
FIG. 1 is a block diagram showing a configuration of a conventional variable-length coding device using a ROM.

In FIG. 1, a 12-bit shift register 100 sequentially inputs data words, a latch circuit 101 latches input data words taken in the shift register 100, and a ROM 102 uses as addresses data words latched by the latch circuit 101 and outputs code words corresponding to the data words. The required capacity $V_1$ of the ROM is $V_1 = 2^{12} \cdot 30 = 122{,}880$ bits. A 30-bit shift register 103 sequentially outputs code words output from the ROM 102, and a latch-signal generating circuit 104 receives the information which is stored in the ROM 102 and is simultaneously output from the ROM 102 when a code word is output in order to provide word synchronization and which represents how many bits the data word has been coded into, and generates a latch signal so that the latch circuit 101 performs a latch operation. Since the configuration of the coding circuit shown in FIG. 1 is a common one, further detailed explanation about its operation or the like will be omitted.

Further, in order to use a recording code, it is necessary to provide a decoding device for inverting a code word into a data word. Among methods for providing a decoding device, there is a method of constituting the device by combining gate circuits, and a method in which a bit string of input code words is made to form address signals, and access is made to a ROM in which a bit string of data words has been written. When a ROM is used in a decoding device using the (d, k, m, n, $r_{max}$) code, its required capacity $V_2$ is represented by $V_2 = 2r_{max} \cdot n \cdot r_{max} \cdot m$ bits. In a varible-length code, it is necessary to provide information representing how many bits are in the code word to be decoded in order to provide word synchronization. This information is usually written also in the same ROM. In the above-described capacity $V_2$, however, the memory capacity corresponding to this information is excluded. For example, a conventional variable-length decoding circuit using the (4, 19, 2, 5, 6) code (the correspondence table between data words and code words of which is shown in Table 1 to be described later) is configured as shown in FIG. 2.

Figure 2:
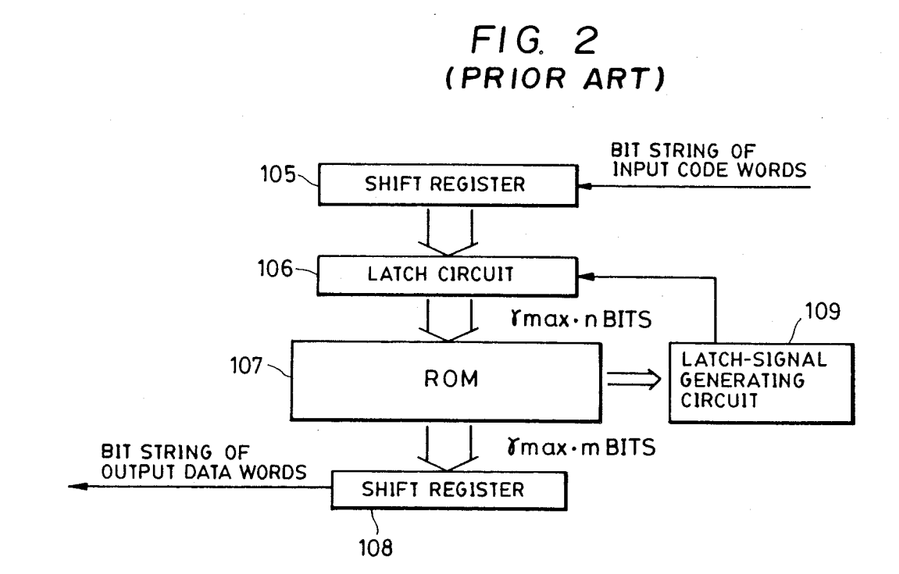
FIG. 2 is a block diagram showing a configuration of a conventional variable-length decoding device using a ROM.

In FIG. 2, a 30-bit shift register 105 sequentially inputs code words, a latch circuit 106 latches the input code words taken in the shift register 105, and a ROM 107 addresses code words latched by the latch circuit 106 and outputs data words corresponding to the code words. The capacity $V_2$ of the ROM is represented by $V_2 = 2^{30} \cdot 12$ bits. A 12-bit shift register 108 sequentially outputs code words output from the ROM 107, and a latch-signal generating circuit 109 inputs the information, which is stored in the ROM 107 and is simultaneously output when a data word is output in order to provide word synchronization and which represents how many bits are in the data word which has been decoded, and generates a latch signal so that the latch circuit 106 performs its latch operation. Since the configuration of the decoding circuit shown in FIG. 2 is a common one, detailed explanation about its operation will be omitted.

Now, in genral, it is possible to improve either of $T_{min}$, $T_{max}$ and $T_w$ by increasing the code word length n. Then, when it is tried to provide a code having better performance in order to realize higher density in the varible-length code as described above, both its code word length and code word number become large. Hence, when it is tried to configure a coding circuit or decoding circuit using a ROM, the required capacity of the ROM increases, and there occurs the inconvenience that the circuits are not practical.

SUMMARY OF THE INVENTION

It is an object of the present invention to provide a variable-length coding/decoding device in which the above-described problems can be solved.

It is another object of the present invention to provide a variable-length coding device which can convert data words into variable-length code words by a memory circuit having a small capacity.

Under such objective, in accordance with one aspect of the present invention, a variable-length coding device in accordance with the present invention is a device for converting an r·m-bit data word into an r·n-bit code word, where r is an integer having the relationship $1 \leq r \leq r_{max}$, a basic data word length consists of m bits (m is a positive integer), and a basic code word length consists of n bits (n is a positive integer), and coding each of the data words of a variable-length run-length-limited code limiting the run number of bits of a first value between successive bits of a second value in a binary-coded bit string generated by concatenation of code words after the conversion to a value no smaller than d and no larger than k (d and k being positive integers), into a code word corresponding thereto, and the variable-length coding device comprises:

first coding means for coding an input data word into $r_{max}·q$ (q is a positive integer) bits, and outputting a first code word; and second coding means for dividing the first code word output from the first coding means into $r_{max}$ blocks each consisting of q bits, coding a code word in each of the blocks, and outputting a second code word.

It is still another object of the present invention to provide a variable-length decoding device which can invert a variable-length code word into a data word by a memory circuit having a small capacity.

Under such objective, in another aspect of the present invention, a variable-length decoding device in accordance with the present invention is a device for converting an r·m-bit data word into an r·n-bit code word, where r is an integer having the relationship $1 \leq r \leq r_{max}$, where a basic data word length consists of m bits (m is a positive integer), and a basic code word length consists of n bits (n is a positive integer), and inverting each of the code words of a variable-length run-length-limited code limiting the run number of bits of a first value between successive bits of a second value in a binary-coded bit string generated by concatenation of code words after the conversion to a value no smaller than d and no larger than k (d and k being positive integers), into a data word corresponding thereto, and the variable-length decoding device comprises:

first decoding means for dividing an input code word into $r_{max}$ blocks each consisting of n bits, decoding a code word in each of the blocks into a q-bit (q is a positive integer) code word, and outputting an $r_{max}·q$-bit first code word; and second coding means for decoding an $r_{max}·q$-bit first code word output from the first decoding means, and outputting a second code word.

The foregoing and other objects and features of the present invention will become more apparent from the following detailed description of the aspects of the present invention taken in connection with the accompanying drawings.

DESCRIPTION OF THE PREFERRED EMBODIMENTS

Now, the present invention will be hereinafter explained with reference to preferred embodiments. In the present embodiment, as an example, a case in which the (4, 19, 2, 5, 6) code is used will be explained by reference to the drawings.

Figure 3:
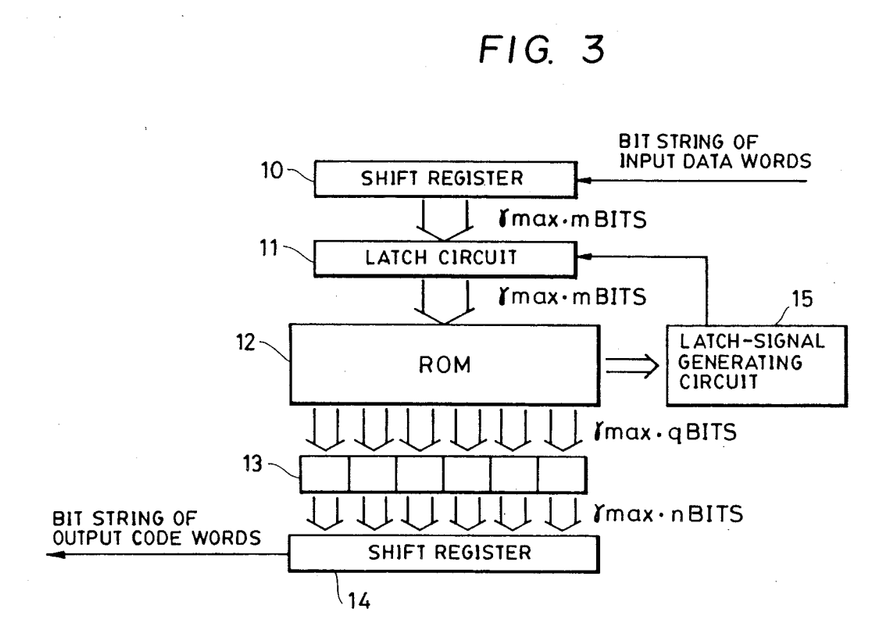
FIG. 3 is a block diagram showing a configuration of a variable-length coding device in accordance with the present invention.

The (4, 19, 2, 5, 6) code is a variable-length code having the basic data word length m=2, basic code word length n=5, number of code word lengths $r_{max}=6$, $T_{min}=2.0$, $T_{max}=8.0$, and $T_w=0.4$. FIG. 3 shows a block diagram of a variable-length coding circuit, in which a bit string of input data is taken in a 12-bit shift register 10, and sent to a latch circuit 11. Then, the 12-bit data are sent to a virtual coding circuit 12. The virtual coding circuit 12 comprises a ROM. Now, the content of the ROM will be explained using Tables 1 through 4 found at the end of the present specification.

First, 3-bit virtual code words are assigned to 6 kinds of basic code words. Although it is arbitrary how to assign 8 kinds of 3-bit virtual code words for 6 kinds of basic code words, the assignment is made here as shown in Table 2. Next, by delimiting code words in Table 1 by 5 bits, and replacing code words by virtual code words according to Table 2, code words are converted into virtual code words, and it is possible to make data words correspond to virtual code words. A part of the correspondence between data words and virtual code words is shown in Table 3. For example, the first data word 00 corresponds to code word 1000 (Table 1). Therefore data word 00 corresponds to virtual code word 001 (Table 3). As another example, the second data word 0100 corresponds to code word [10000][00000], as delimited by 5 bits, and so corresponds to virtual code word 001 000. For a maximum length data word of 12 bits, the corresponding data word has 30 bits and the corresponding virtual code word has 18 (=30×3/5) bits. Now, an explanation will be given as to which addresses in the ROM within the virtual coding circuit 12 these bit strings of 18-bit virtual code words are to be assigned.

When the first 2 bits of an input data word are "00", "001" may be output as a virtual code word. Accordingly, "001 000 000 000 000 000" is written in 1024 words from the address "000000000000" to the address "001111111111". Similarly, when an input data word is "110010", "101 000 000" may be output as a virtual code word. Hence, "101 000 000 000 000 000" is assigned in 64 words from the address "110010000000" to the address "110010111111". In general, when r·m bits from the start in an input data string within the input shift register 10 are objects of coding, a virtual code word corresponding to its data word is assigned in $2(r_{max}-r)$ words in the entire address for $r_{max}$·m bits which is the data word for r·m bits from the start. In this case, $(r_{max}-r)$·n "0" bits are added so that each of data consists of $r_{max}$·n (6×5=30) bits in total. A part of the memory map in the ROM within the virtual coding circuit 12 corresponding to the (4, 19, 2, 5, 6) code thus obtained, is shown in Table 4. Further, the information representing how many bits the data word has been virtually coded into is stored also within the ROM. The capacity of the ROM which is necessary in this case can be reduced by 3/5 compared with the conventional case.

Virtually-coded data are output from the ROM within the virtual coding circuit 12, making an output from the latch circuit 11 an address. A data word output from the latch circuit 11 is virtually coded, and supplied to a final coding circuit 13. The final coding circuit 13 comprises six identical coding circuits, each of them corresponding to a 5-bit basic code word. Each of coding circuits in the final coding circuit 13 may be constituted by a ROM, or by gate circuits or the like. In each of coding circuits, each of 3-bit virtual code words is converted into a 5-bit basic code word, and code words having 30 bits in total are supplied to a shift register 14 for output. Simultaneously, the information representing how many bits the data word has been virtually coded into by the virtual coding circuit 12, which is stored in the ROM within the virtual coding circuit 12, is sent to a latch-signal generating circuit 15. When it is confirmed by the latch-signal generating circuit 15 according to this information that, for example, a 4-bit data word has been virtually coded, and the new 4-bit data word is further input in the shift register 10, a latch signal is generated from the latch-signal generating circuit 15, and the data word is latched in the virtual coding circuit 12 by the latch circuit 11. The code word sent to the shift register 14 for output is then converted into serial form and output bit by bit. Though not illustrated in FIG. 3, a clock having a frequency 2.5 times that of a clock frequency supplied to the shift register 11 and latch-signal generating circuit 15 is supplied to the shift register 14 for output. The coding circuit is configured so that the shift register 14 for output shifts code words by 5 bits while the shift register 10 for input shifts data words by 2 bits.

Figure 4:
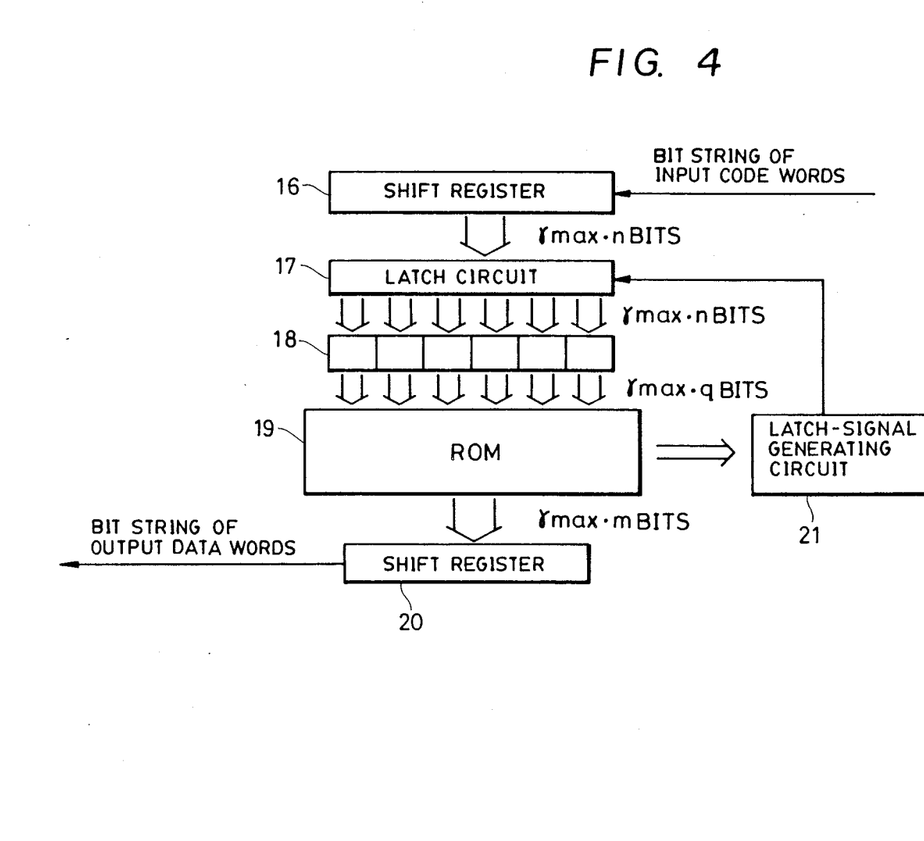
FIG. 4 is a block diagram of a configuration of a variable-length decoding device in accordance with the present invention.

FIG. 4 shows a block diagram of a variable-length decoding circuit corresponding to the variable-length coding circuit shown in FIG. 3. In FIG. 4, a bit string of input code words is taken in a 30-bit input shift register 16, and sent to a latch circuit 17. This 30-bit bit string of input code words is further sent to a virtual decoding circuit 18. The virtual decoding circuit 18 comprises six identical decoding circuits, each of them virtually decoding a 5-bit basic code word. Each of the decoding circuits in the virtual decoding circuit 18 may be constituted by a ROM, or by gate circuits or the like. Now, the method of virtual decoding and the content of a ROM within a final decoding circuit 19 which is used for final decoding will be explained with reference to Tables 1 through 3, 5 and 6. Table 1 is the correspondence table between data words and code words of the (4, 19, 2, 5, 6) code.

First, 3-bit virtual decode words are assigned to 6 kinds of basic code words. Although it is arbitrary how to assign 8 kinds of 3-bit virtual decode words for 6 kinds of basic code words, assignment is made here as shown in FIG. 2. The virtual decoding circuit 18 converts each of basic code words into a 3-bit virtual decode word according to the correspondence shown in FIG. 2, and outputs the decode word. Further, by delimiting code words shown in Table 1 by 5 bits, and replacing code words by virtual decode words according to Table 2, code words are converted into virtual decode words, and it is possible to make data words correspond to virtual decode words. A part of the correspondence between data words and virtual decode words is shown in Table 3. Next, these bit strings of 18-bit virtual decode words are made address signals in the ROM within the final decoding circuit 19, and data stored in the ROM are accessed. Now, an explanation will be given as to which addresses data shown in Table 3 are assigned.

As is apparent from Table 1, when it is assumed $r_2 > r_1$ ($r_1$ and $r_2$ are the numbers of code word lengths), there are cases in which a $5r_1$-bit code word and $5r_1$ bits from the head of a $5r_2$-bit code word are equal. For example, code words in which the leading 5 bits are "10000" are shown in Table 5. When the leading 5 bits within the input shift register 16 are "10000" (the virtual decode word corresponding to the code word "10000" is "001", which actually becomes the input to the ROM within the final decoding circuit 19) as shown in Table 5, the "10000" cannot instantaneously be decoded, because it is necessary to give priority to a code word having long word length. In order realize this process by arrangement of data within the ROM of the final decoding circuit 19, the following procedure is taken.

For example, relative to data for a 9-bit virtual decode word, for all 18-bit address $2^9 = 512$ words in which the leading 9 bits are the same as the 9-bit virtual decode word, six 0's are added after the corresponding data words so as to be 12 bits in total. However, if there is an overlapping address when addresses have similarly been assigned for 3r-bit (r>3) virtual decode words, data of a virtual decode word having a longer word length are preferred. Further, in the case of general varible-length codes, relative to data for an r·q-bit virtual decode word, for all $r_{max}$·q-bit address $2(r_{max}-r)$·q words in which the leading r·q bits are the same as the r·q-bit virtual decode word, m·($r_{max}-r$) 0's are added after the corresponding data words so as to be $r_{max}$·m bits in total. In the case of an overlapping address, data for a code word having a longer word length is preferred.

A part of the memory map in the ROM within the final decoding circuit 19 which has been prepared as described above is shown in Table 6. The memory map, a part of which is shown in Table 6, is for a case in which the leading three bits of virtual decode words are "001". Similar tables can also be obtained for other cases. Further, the information representing how many bit-code words have been decoded is also stored within the ROM. Thus, the required capacity of the ROM can be reduced down to $2^{-12}$ compared with the conventional case.

Next, a 12-bit data word output from the ROM of the final decoding circuit 19 is supplied to a 12-bit shift register 20 for output. Simultaneously, the information representing how many bits are in the code word to be decoded by the final decoding circuit 19, which is stored in the ROM of the final decoding circuit 19, is sent to a latch-signal generating circuit 21. When it is confirmed by the latch-signal generating circuit 21 according to this information that, for example, a 10-bit code word has been decoded, and the new 10-bit code word is further input in the shift register 16 for input, a latch signal is generated from the latch-signal generating circuit 21, and the code word is latched in the virtual decoding circuit 18 by the latch circuit 17. The data word sent to the shift register 20 for output is then converted into serial form and output bit by bit. Though not illustrated in FIG. 4, a clock having a frequency 2/5 times that of a clock frequency supplied to the shift register 16 for input and the latch-signal generating circuit 21 is supplied to the shift register 20 for output. The decoding circuit is configured so that the shift register 20 for output shifts data words by 4 bits while the shift register 16 for input shifts code words by 10 bits.

Next, as a second embodiment of the present invention, a case in which the (5, 16, 2, 6, 4) code is applied will be explained. This code is a variable-length code having the basic data word length m=2, basic code word length n=6, number of code word lengths $r_{max}=4$, $T_{min}=2.0$, $T_{max}=5.7$, $T_w=0.33$. In Table 7, the correspondence table between data words and code words is shown. In the second embodiment, the configuration of a varible-length coding device is such that, in FIG. 3, the shift register 10 for input consists of 8 bits, and the shift register 14 for output consists of 24 bits. Further, the final coding circuit 13 in FIG. 3 comprises four coding circuits. The number of basic code words is seven. Hence, the representation by 3-bit virtual code words is possible. The correspondence between the basic code words and virtual code words is as shown in Table 8. Accordingly, a part of the correspondence between input data words and virtual code words, and a part of the memory map of the ROM in the virtual coding circuit 12 are as shown in Table 9 and Table 10, respectively. Consequently, the capacity of the ROM in the second embodiment can be reduced to 3/6 =½ compared with that in the conventional case. The circuit operation is the same as that in the case in which the (4, 19, 2, 5, 6) code is applied, that is, in the first embodiment. Hence, detailed explanation thereof will be omitted.

Further, in the case of the second embodiment, the configuration of a variable-length decoding circuit is such that, in FIG. 4, the shift register 16 for input consists of 24 bits, and the shift register 20 for output consists of 8 bits. The virtual decoding circuit 18 in FIG. 4 comprises four decoding circuits. The number of basic code words is seven. Hence, the representation by 3-bit virtual decode words is possible. The correspondence between the basic code words and virtual decode words is as shown in Table 8. Accordingly, a part of the correspondence between virtual decode words and output data words is as shown in Table 9. Table 11 shows the memory map for a case in which the preceding 3 bits of virtual decode words are, for example, "100" (the basic code word corresponding to the virtual decode word "100" is "000100"). In this case, there is no overlapping of addresses. Memory maps for other cases can similarly be obtained. Consequently, the required capacity of the ROM in the second embodiment can be reduced down to $2^{-12}$ compared with that in the conventional case. The circuit operation is the same as that in the case in which the (4, 19, 2, 5, 6) code is applied. Hence, explanation thereof will be omitted.

TABLE 1

Data word/code word correspondence table of the (4, 19, 2, 5, 6) code

| Data word | Code word |
|---|---|
| (00) | 10000 |
| (0100) | 1000000000 |
| (0101) | 0100000000 |
| (0110) | 0010000000 |
| (0111) | 0001000000 |
| (1000) | 0000100000 |
| (100100) | 100000000000000 |
| (100101) | 010000100000000 |
| (100110) | 010000010000000 |
| (100111) | 010000001000000 |
| (101000) | 010000000100000 |
| (101001) | 010000000000000 |
| (101010) | 001000010000000 |
| (101011) | 001000001000000 |
| (101100) | 001000000100000 |
| (101101) | 001000000000000 |
| (101110) | 000100001000000 |
| (101111) | 000100000100000 |
| (110000) | 000100000000000 |
| (110001) | 000010000100000 |
| (110010) | 000010000000000 |
| (11001100) | 010000100000100000 |
| (11001101) | 010000100000010000 |
| (11001110) | 010000100000001000 |
| (11001111) | 010000100000000100 |
| (11010000) | 010000100000000000 |
| (11010001) | 010000010000010000 |
| (11010010) | 010000010000001000 |
| (11010011) | 010000010000000100 |
| (11010100) | 010000010000000000 |
| (11010101) | 010000001000001000 |
| (11010110) | 010000001000000100 |
| (11010111) | 010000001000000000 |
| (11011000) | 010000000100000100 |
| (11011001) | 010000000100000000 |
| (11011010) | 001000010000010000 |
| (11011011) | 001000010000001000 |
| (11011100) | 001000010000000100 |
| (11011101) | 001000010000000000 |
| (11011110) | 001000001000001000 |
| (11011111) | 001000001000000100 |
| (11100000) | 001000001000000000 |
| (11100001) | 001000000100000100 |
| (11100010) | 001000000100000000 |
| (11100011) | 000100001000001000 |
| (11100100) | 000100001000000100 |
| (11100101) | 000100001000000000 |
| (11100110) | 000100000100000100 |
| (11100111) | 000100000100000000 |
| (11101000) | 000010000100000100 |
| (11101001) | 000010000100000000 |
| (11101010) | 000010000000000000 |
| (1110101100) | 100000000000000000010000 |
| (1110101101) | 010000100001000010000000 |
| (1110101110) | 010000100001000010000000 |
| (1110101111) | 010000100001000001000000 |
| (1110110000) | 010000100001000000100000 |
| (1110110001) | 010000100001000000000000 |
| (1110110010) | 010000100000100010000000 |
| (1110110011) | 010000100000100001000000 |
| (1110110100) | 010000100000100000100000 |
| (1110110101) | 010000100000100000000000 |
| (1110110110) | 010000100000010010000000 |
| (1110110111) | 010000100000010000100000 |
| (1110111000) | 010000100000010000000000 |
| (1110111001) | 010000100000001010000100 |
| (1110111010) | 010000100000001000000000 |
| (1110111011) | 010000010001000010000000 |

TABLE 1-continued

Data word/code word correspondence table of the (4, 19, 2, 5, 6) code

| Data word | Code word |
|---|---|
| (1110111100) | 0100001000010000010000000 |
| (1110111101) | 0100001000010000001000000 |
| (1110111110) | 0100001000010000000000000 |
| (1110111111) | 0100001000010000100001000000 |
| (1111000000) | 0100001000010000100000000 |
| (1111000001) | 0100001000010000000000000 |
| (1111000010) | 0100001000000100000100000 |
| (1111000011) | 0100001000000100000000000 |
| (1111000100) | 0100000100001000001000000 |
| (1111000101) | 0100000100001000000100000 |
| (1111000110) | 0100000100001000000000000 |
| (1111000111) | 0100000001000010000100000 |
| (1111001000) | 0100000001000010000000000 |
| (1111001001) | 0100000001000010000100000 |
| (1111001010) | 0100000001000010000000000 |
| (1111001011) | 0100000001000000000000000 |
| (1111001100) | 0100000000000000000010000 |
| (1111001101) | 0010000100001000010000000 |
| (1111001110) | 0010000100001000001000000 |
| (1111001111) | 0010000100001000000100000 |
| (1111010000) | 0010000100001000000000000 |
| (1111010001) | 0010000100000100001000000 |
| (1111010010) | 0010000100000100000100000 |
| (1111010011) | 0010000100000100000000000 |
| (1111010100) | 0010000100000010000100000 |
| (1111010101) | 0010000100000010000000000 |
| (1111010110) | 0010000100000010000100000 |
| (1111010111) | 0010000100000100000100000 |
| (1111011000) | 0010000010000100000000000 |
| (1111011001) | 0010000010000100001000000 |
| (1111011010) | 0010000010000100000000000 |
| (1111011011) | 0010000010000100000100000 |
| (1111011100) | 0010000010000010000000000 |
| (1111011101) | 0010000010000000000000000 |
| (1111011110) | 0010000000000000000010000 |
| (1111011111) | 0001000010000100001000000 |
| (1111100000) | 0001000010000100000100000 |
| (1111100001) | 0001000010000100000000000 |
| (1111100010) | 0001000010000010000100000 |
| (1111100011) | 0001000010000010000000000 |
| (1111100100) | 0001000010000010000100000 |
| (1111100101) | 0001000010000010000000000 |
| (1111100110) | 0001000010000000000000000 |
| (1111100111) | 0001000000000000000010000 |
| (1111101000) | 0000100001000010000100000 |
| (1111101001) | 0000100001000010000000000 |
| (1111101010) | 0000100001000000000000000 |
| (111110101100) | 01000010000100001000001000000 |
| (111110101101) | 01000010000100001000000010000 |
| (111110101110) | 01000010000100001000000001000 |
| (111110101111) | 01000010000100001000000000100 |
| (111110110000) | 01000010000100001000010000000 |
| (111110110001) | 01000010000100001000001000000 |
| (111110110010) | 01000010000100001000000010000 |
| (111110110011) | 01000010000100000100001000000 |
| (111110110100) | 01000010000100000100000100000 |
| (111110110101) | 01000010000100000010001000000 |
| (111110110110) | 10000010000100001000010000000 |
| (111110110111) | 01000010000100001000000010000 |
| (111110111000) | 01000010000100001000010000000 |
| (111110111001) | 01000010000100001000001000000 |
| (111110111010) | 01000010000100001000000100000 |
| (111110111011) | 01000010000100001000000010000 |
| (111110111100) | 01000010000100001000010000000 |
| (111110111101) | 01000010000010000100001000000 |
| (111110111110) | 01000010000010000100000100000 |
| (111110111111) | 01000010000010000100000010000 |
| (111111000000) | 01000010000100001000010000000 |
| (111111000001) | 01000010000100001000010000000 |
| (111111000010) | 01000010000100001000001000000 |
| (111111000011) | 01000010000100001000000010000 |
| (111111000100) | 01000010000100001000001000000 |
| (111111000101) | 01000010000100001000000100000 |
| (111111000110) | 01000010000100000100001000000 |
| (111111000111) | 10000010000100001000000010000 |
| (111111001000) | 01000010000100001000001000000 |
| (111111001001) | 01000010000100001000000100000 |
| (111111001010) | 01000010000100001000000000000 |

| Data word | Code word |
|---|---|
| (111111001011) | 01000010000010000100000100000 |
| (111111001100) | 10000010000010000100000000000 |
| (111111001101) | 01000010000010000100000100000 |
| (111111001110) | 01000010000010000100000000000 |
| (111111001111) | 10000000100001000010000100000 |
| (111111010000) | 10000000100001000010000100000 |
| (111111010001) | 10000000100001000010000000000 |
| (111111010010) | 01000010000010000100000100000 |
| (111111010011) | 01000010000010000100000000000 |
| (111111010100) | 01000010000010000100000100000 |
| (111111010101) | 01000010000010000100000000000 |
| (111111010110) | 01000000100001000010000100000 |
| (111111010111) | 01000000100001000010000000000 |
| (111111011000) | 01000010000010000100000100000 |
| (111111011001) | 00100001000010000100000100000 |
| (111111011010) | 00100001000010000100000000000 |
| (111111011011) | 00100001000010000100000000000 |
| (111111011100) | 00100001000010000010000100000 |
| (111111011101) | 00100001000010000010000000000 |
| (111111011110) | 00100001000010000010000000000 |
| (111111011111) | 00100001000010000010000000000 |
| (111111100000) | 00100001000010000010000000000 |
| (111111100001) | 00100001000010000010000100000 |
| (111111100010) | 00100001000010000010000000000 |
| (111111100011) | 00100001000010000010000000000 |
| (111111100100) | 00100001000010000010000100000 |
| (111111100101) | 00100001000010000010000000000 |
| (111111100110) | 00100001000000100000100000000 |
| (111111100111) | 00100001000000100000000000000 |
| (111111101000) | 00100000100001000010000100000 |
| (111111101001) | 00100000100001000010000000000 |
| (111111101010) | 00100000100001000010000000000 |
| (111111101011) | 00100000100001000010000000000 |
| (111111101100) | 00100000100001000010000000000 |
| (111111101101) | 00100000100001000010000000000 |
| (111111101110) | 00100000100001000010000000000 |
| (111111101111) | 00100000010000100000100000000 |
| (111111110000) | 00100000010000100000000000000 |
| (111111110001) | 00100001000010000010000100000 |
| (111111110010) | 00100001000010000010000000000 |
| (111111110011) | 00100001000010000010000000000 |
| (111111110100) | 00100001000010000010000000000 |
| (111111110101) | 00100001000010000010000000000 |
| (111111110110) | 00100001000010000010000000000 |
| (111111110111) | 00100001000010000010000000000 |
| (111111111000) | 00100001000010000010000000000 |
| (111111111001) | 00100001000010000010000000000 |
| (111111111010) | 00001000010000100000100000000 |
| (111111111011) | 00001000010000100000000000000 |
| (111111111100) | 01000010000010000100000000000 |
| (111111111101) | 01000010000010000100000000000 |
| (111111111110) | 01000010000010000100000000000 |
| (111111111111) | 01000010000010000100000000000 |
|  | 10000000000000000001000000 |
|  | 01000010000010000000000000 |
|  | 01000010000000000000010000 |
|  | 01000010000000000010000000 |
|  | 01000010000000000000010000 |
|  | 01000000100001000000000000 |
|  | 01000000100000000000010000 |
|  | 01000000100000000000000000 |
|  | 01000000010000000000000000 |
|  | 01000000000000000010000000 |
|  | 01000000000000000001000000 |
|  | 00100001000001000000000000 |
|  | 00100001000000000000010000 |
|  | 00100001000001000000000000 |
|  | 00100001000001000000010000 |
|  | 00100001000001000000000000 |
|  | 00100001000001000000000000 |
|  | 00100000000000000001000000 |
|  | 00100000000000000000010000 |
|  | 00100000000000000000100000 |
|  | 00100000000000000000010000 |
|  | 00010000100001000000000000 |
|  | 00010000100000000000000010 |

TABLE 1-continued

Data word/code word correspondence table of the (4, 19, 2, 5, 6) code

| Data word | Code word |
|---|---|
| | 0000100001000010000000000000 |
| | 0100001000010000100000000000 |
| | 0100001000010000010000000000 |
| | 0100001000010000001000000000 |
| | 0100001000010000000100000000 |
| | 0100001000010001000000000000 |
| | 0100001000010000100000000000 |
| | 0100001000001000010000000000 |
| | 0100001000001000010000000000 |

TABLE 2

| Basic code word | Virtual code word/virtual decode word |
|---|---|
| 00000 | (000) |
| 10000 | (001) |
| 01000 | (010) |
| 00100 | (011) |
| 00010 | (100) |
| 00001 | (101) |

TABLE 3

| Data word | Virtual code word/virtual decode word |
|---|---|
| 00 | 001 |
| 0100 | 001 000 |
| 0101 | 010 000 |
| 0110 | 011 000 |
| 0111 | 100 000 |
| 1000 | 101 000 |
| 100100 | 001 000 000 |
| 100101 | 010 010 000 |
| 100110 | 010 011 000 |
| 100111 | 010 100 000 |
| 101000 | 010 101 000 |
| 101001 | 010 000 000 |
| 101010 | 011 011 000 |
| 101011 | 011 100 000 |
| 101100 | 011 101 000 |
| 101101 | 011 000 000 |
| 101110 | 100 100 000 |
| 101111 | 100 101 000 |
| 110000 | 100 000 000 |
| 110001 | 101 101 000 |
| 110010 | 101 000 000 |
| 11001100 | 010 010 010 000 |
| 11001101 | 010 010 011 000 |

TABLE 4

| Address | Data |
|---|---|
| 000000000000 - 001111111111 | 001 000 000 000 000 000 |
| 010000000000 - 010011111111 | 001 000 000 000 000 000 |
| 010100000000 - 010111111111 | 010 000 000 000 000 000 |
| 011000000000 - 011011111111 | 011 000 000 000 000 000 |
| 011100000000 - 011111111111 | 100 000 000 000 000 000 |
| 100000000000 - 100011111111 | 101 000 000 000 000 000 |
| 100100000000 - 100100111111 | 001 000 000 000 000 000 |
| 100101000000 - 100101111111 | 010 010 000 000 000 000 |
| 100110000000 - 100110111111 | 010 011 000 000 000 000 |
| 100111000000 - 100111111111 | 010 100 000 000 000 000 |
| 101000000000 - 101000111111 | 010 101 000 000 000 000 |
| 101001000000 - 101001111111 | 010 000 000 000 000 000 |
| 101010000000 - 101010111111 | 011 011 000 000 000 000 |
| 101011000000 - 101011111111 | 011 100 000 000 000 000 |
| 101100000000 - 101100111111 | 011 101 000 000 000 000 |
| 101101000000 - 101101111111 | 011 000 000 000 000 000 |
| 101110000000 - 101110111111 | 100 100 000 000 000 000 |
| 101111000000 - 101111111111 | 100 101 000 000 000 000 |
| 110000000000 - 110000111111 | 100 000 000 000 000 000 |
| 110001000000 - 110001111111 | 101 101 000 000 000 000 |
| 110010000000 - 110010111111 | 101 000 000 000 000 000 |
| 110011000000 - 110011001111 | 010 010 010 000 000 000 |
| 110011010000 - 110011011111 | 010 010 011 000 000 000 |

TABLE 5

| Code word | Data word |
|---|---|
| 10000 | 00 |
| 10000 00000 | 0100 |
| 10000 00000 00000 | 100100 |
| 10000 00000 00000 00000 10000 | 1110101100 |

TABLE 6

| Address | Data |
|---|---|
| (a) 001000000000001000 --- 001000000000001111 | 111010110000 |
| (b) 001000000000000000 --- 001000000111111111 (addresses in (a) are excluded) | 100100000000 |
| (c) 001000000000000000 --- 001000111111111111 (addresses in (a) and (b) are excluded) | 010000000000 |
| (d) 001000000000000000 --- 001111111111111111 (addresses in (a), (b) and (c) are excluded) | 000000000000 |

TABLE 7

Data word/code word correspondence table of the (3, 16, 2, 6, 4) code

| Data word | Code word |
|---|---|
| (00) | 100000 |
| (0100) | 010000000000 |
| (0101) | 001000000000 |
| (0110) | 000100000000 |
| (0111) | 000010000000 |
| (1000) | 000001000000 |
| (1001) | 000000100000 |
| (101000) | 010000010000000000 |
| (101001) | 010000001000000000 |
| (101010) | 010000000100000000 |
| (101011) | 010000000010000000 |
| (101100) | 010000000001000000 |
| (101101) | 001000001000000000 |
| (101110) | 001000000100000000 |
| (101111) | 001000000010000000 |
| (110000) | 001000000001000000 |
| (110001) | 000100001000000000 |
| (110010) | 000100000010000000 |
| (110011) | 000100000001000000 |
| (110100) | 000010000010000000 |
| (110101) | 000010000001000000 |
| (110110) | 000001000001000000 |
| (11011100) | 000010000100000100000000 |
| (11011101) | 000010000100000001000000 |
| (11011110) | 000010000100000100000000 |
| (11011111) | 000001000100000001000000 |
| (11100000) | 100000000000000001000000 |
| (11100001) | 010000010000010000000000 |
| (11100010) | 010000010000001000000000 |
| (11100011) | 010000010000000100000000 |
| (11100100) | 010000010000000010000000 |
| (11100101) | 010000010000000001000000 |
| (11100110) | 010000001000001000000000 |
| (11100111) | 010000001000000100000000 |
| (11101000) | 010000001000000010000000 |
| (11101001) | 010000001000000001000000 |
| (11101010) | 010000000100000100000000 |
| (11101011) | 010000000100000010000000 |
| (11101100) | 010000000100000001000000 |
| (11101101) | 010000000010000010000000 |
| (11101110) | 010000000010000001000000 |
| (11101111) | 010000000001000001000000 |
| (11110000) | 001000001000001000000000 |
| (11110001) | 001000001000000100000000 |
| (11110010) | 001000001000000010000000 |
| (11110011) | 001000001000000001000000 |
| (11110100) | 001000000100000100000000 |
| (11110101) | 001000000100000010000000 |
| (11110110) | 001000000100000001000000 |
| (11110111) | 001000000010000010000000 |
| (11111000) | 001000000010000001000000 |
| (11111001) | 001000000001000001000000 |
| (11111010) | 000100000100000100000000 |
| (11111011) | 000100000100000010000000 |
| (11111100) | 000100000100000001000000 |
| (11111101) | 000100000100000010000000 |

TABLE 7-continued

Data word/code word correspondence table of the (3, 16, 2, 6, 4) code

| Data word | Code word |
|---|---|
| (11111110) | 0001000000100000010000000 |
| (11111111) | 0001000000 1000001000000 |

TABLE 8

| Basic code word | Virtual code word/virtual decode word |
|---|---|
| 000000 | (000) |
| 100000 | (001) |
| 010000 | (010) |
| 001000 | (011) |
| 000100 | (100) |
| 000010 | (101) |
| 000001 | (110) |

TABLE 9

| Data word | Virtual code word/virtual decode word |
|---|---|
| 00 | 001 |
| 0100 | 010 000 |
| 0101 | 011 000 |
| 0110 | 100 000 |
| 0111 | 101 000 |
| 1000 | 110 000 |
| 1001 | 000 001 |
| 101000 | 010 010 000 |
| 101001 | 010 011 000 |
| 101010 | 010 100 000 |
| 101011 | 010 101 000 |
| 101100 | 010 110 000 |
| 101101 | 011 011 000 |

TABLE 10

| Address | Data |
|---|---|
| 00000000 - 00111111 | 001 000 000 000 |
| 01000000 - 01001111 | 010 000 000 000 |
| 01010000 - 01011111 | 011 000 000 000 |
| 01100000 - 01101111 | 100 000 000 000 |
| 01110000 - 01111111 | 101 000 000 000 |
| 10000000 - 10001111 | 110 000 000 000 |
| 10010000 - 10011111 | 000 001 000 000 |
| 10100000 - 10100011 | 010 010 000 000 |
| 10100100 - 10100111 | 010 011 000 000 |
| 10101000 - 10101011 | 010 100 000 000 |
| 10101100 - 10101111 | 010 110 000 000 |
| 10110000 - 10110011 | 010 110 000 000 |
| 10110100 - 10110111 | 011 011 000 000 |

TABLE 11

| | Address | Data |
|---|---|---|
| (a) | 100100100000 | 11111010 |
| | 100100101000 | 11111011 |
| | 100100110000 | 11111100 |
| | 100101101000 | 11111110 |
| | 100101110000 | 11111111 |
| | 100110110000 | |
| (b) | 100100000000 - 100100000111 | 11000100 |
| | 100101000000 - 100101000111 | 11001000 |
| | 100110000000 - 100110000111 | 11001100 |
| (c) | 100000000000 - 100000111111 | 01100000 |

What is claimed is:

1. A variable-length coding device for converting an r·m-bit data word into an r·n-bit code word, where r is an integer having the relationship $1 \leq r \leq r_{max}$, a basic data word length consists of m bits (m being a positive integer), and a basic code word length consists of n bits (n being a positive integer), and converting each of the data words of a variable-length run-length-limited code limiting the run number of bits of a first value between successive bits of a second value in a binary-coded bit string generated by concatenation of code words after the conversion to a value no smaller than d and no larger than k (d and k being positive integers), into a code word corresponding thereto, said variable-length coding device comprising:

(A) first coding means for coding an input data word into $r_{max} \cdot q$ (q is a positive integer) bits, and outputting a first code word; and (B) second coding means for dividing the first code word output from said first coding means into $r_{max}$ blocks each consisting of q bits, coding a code word in each of the blocks, and outputting a second code word.

2. A variable-length coding device according to claim 1, wherein, when there are p (p being a positive integer) kinds of patterns of basic code words having an n-bit basic code word length, said first coding means outputs a code word, each block of which consists of a q-bit (q is a minimum integer satisfying $p < 2^q$) code word corresponding to said p kinds of basic code word patterns, by $r_{max}$ blocks for the input data word.

3. A variable-length coding device according to claim 2, wherein said second coding means includes $r_{max}$ encoders, each of which receives a respective q-bit code word and each of which outputs an n-bit code word having a basic code word pattern uniquely assigned by the respective q-bit code word.

4. A variable-length coding device according to claim 1, wherein said first coding means includes a memory circuit.

5. A variable-length coding device according to claim 1, wherein said second coding device includes a memory circuit.

6. A variable-length coding device according to claim 1, wherein said second coding means includes gate circuits.

7. A variable-length decoding device for converting an r·m-bit data word into an r·n-bit code word, where r is an integer having the relationship $1 \leq r \leq r_{max}$, a basic data word length consists of m bits (m being a positive integer), and a basic code word length consists of n bits (n being a positive integer), and inverting each of the code words of a variable-length run-length-limited code limiting the run number of bits of a first value between successive bits of a second value in a binary-coded bit string generated by concatenation of code words after the conversion to a value no smaller than d and no larger than k (d and k being positive integers), into a data word corresponding thereto, said variable-length decoding device comprising:

(A) first decoding means for dividing an input code word into $r_{max}$ blocks each consisting of n bits, decoding a code word in each of the blocks into a q-bit (q is a positive integer) code word, and outputting a $r_{max} \cdot q$-bit first code word; and (B) second decoding means for decoding the $r_{max} \cdot q$-bit first code word output from said first decoding means, and outputting a second code word.

8. A variable-length decoding device according to claim 7, wherein said first decoding means includes $r_{max}$ decoders, and each of the decoders is arranged so that, when there are p (p is a positive integer) kinds of patterns of basic code words having an n-bit basic code word length, it outputs a code word consisting of q (q is a minimum integer satisfying $p < 2^q$) bits corresponding to said p kinds of basic code word patterns.

9. A variable-length decoding device according to claim 8, wherein said second decoding means is arranged so that it outputs an $r_{max} \cdot n$ bit code word having a code word pattern uniquely assigned by the $r_{max} \cdot q$-bit code word.

10. A variable-length decoding device according to claim 7, wherein said first decoding means includes a memory circuit.

11. A variable-length decoding device according to claim 7, wherein said first decoding means includes gate circuits.

12. A variable-length decoding device according to claim 7, wherein said second decoding means includes a memory circuit.

* * * * *